(12) United States Patent
Todokoro et al.

(10) Patent No.: US 7,977,632 B2
(45) Date of Patent: Jul. 12, 2011

(54) SCANNING ELECTRON MICROSCOPE

(75) Inventors: Hideo Todokoro, Hinode-cho (JP); Makoto Ezumi, Mito (JP); Yasutsugu Usami, Toshima-ku (JP)

(73) Assignee: Hitachi, Ltd., Tokyo (JP)

( * ) Notice: Subject to any disclaimer, the term of this patent is extended or adjusted under 35 U.S.C. 154(b) by 131 days.

(21) Appl. No.: 12/253,476

(22) Filed: Oct. 17, 2008

(65) Prior Publication Data
US 2009/0039259 A1 Feb. 12, 2009

Related U.S. Application Data

(63) Continuation of application No. 11/282,645, filed on Nov. 21, 2005, now Pat. No. 7,442,923, which is a continuation of application No. 10/648,388, filed on Aug. 27, 2003, now abandoned, which is a continuation of application No. 09/477,060, filed on Jan. 3, 2000, now Pat. No. 6,635,873.

(30) Foreign Application Priority Data

Jan. 4, 1999 (JP) .................................. 11-000222

(51) Int. Cl.
*G21K 7/00* (2006.01)
(52) U.S. Cl. .................... 250/310; 250/311; 324/751
(58) Field of Classification Search .................. 250/310
See application file for complete search history.

(56) References Cited

U.S. PATENT DOCUMENTS

| | | | |
|---|---|---|---|
| 3,714,425 A * | 1/1973 | Someya et al. | ............... 250/311 |
| 4,897,545 A | 1/1990 | Danilatos | |
| 5,389,787 A | 2/1995 | Todokoro et al. | |
| 4,122,095 A | 5/1995 | Otaka et al. | |
| 5,412,209 A * | 5/1995 | Otaka et al. | ........................ 850/9 |
| 5,491,339 A | 2/1996 | Mitsui et al. | |
| 5,612,626 A * | 3/1997 | Golladay | ................. 324/754.22 |
| 5,757,409 A | 5/1998 | Okamoto et al. | |
| 5,866,904 A | 2/1999 | Todokoro et al. | |
| 5,869,833 A | 2/1999 | Richardson et al. | |
| 5,973,323 A | 10/1999 | Adler et al. | |
| 6,066,849 A | 5/2000 | Masnaghetti et al. | |

(Continued)

FOREIGN PATENT DOCUMENTS

JP 62-031931 A 2/1987

(Continued)

*Primary Examiner* — Phillip A Johnston
(74) *Attorney, Agent, or Firm* — Kenyon & Kenyon LLP

(57) ABSTRACT

To make it possible to observe the bottom of a contact hole and internal wires, in observation of the contact hole 102, by scanning it at a predetermined acceleration voltage, the positive charge 106 is formed on the surface of the insulator 101, and the secondary electrons 104 are attracted in the hole by this electric field, and the hole is continuously scanned at an acceleration voltage different from the acceleration voltage, and the sample is observed. When the wires embedded in the insulator are to be observed, by observing the insulator at a predetermined acceleration voltage, an electron beam is allowed to enter the sample, and the sample is continuously scanned at an acceleration voltage different from the acceleration voltage, and hence the existence of wires is reflected as a change in the charge of the surface, and it is observed. In either case, the acceleration voltage before observation is different from the one during observation, and the sample surface is temporarily radiated at an acceleration voltage positively generating a positive or negative charge, and thereafter, the acceleration voltage is returned to a one suited to observation, and the sample is observed.

2 Claims, 9 Drawing Sheets

U.S. PATENT DOCUMENTS

| | | |
|---|---|---|
| 6,429,427 B1 | 8/2002 | Frosien |
| 6,509,564 B1 * | 1/2003 | Suzuki et al. ................ 250/310 |
| 6,635,873 B1 | 10/2003 | Todokoro et al. |

FOREIGN PATENT DOCUMENTS

| | | |
|---|---|---|
| JP | 62-056807 A | 3/1987 |
| JP | 07-014537 | 1/1995 |
| JP | 7-014537 A | 1/1995 |
| JP | 7-262957 | 10/1995 |
| JP | 7-296759 A | 11/1995 |
| JP | 09-219171 | 8/1997 |
| JP | 9-219171 A | 8/1997 |
| JP | 10-74478 | 3/1998 |

* cited by examiner

SCANNING ELECTRON MICROSCOPE

This is a continuation of application Ser. No. 11/282,645 filed 21 Nov. 2005 now U.S. Pat. No. 7,442,923, which is a continuation of application Ser. No. 10/648,388 filed 27 Aug. 2003 now abandoned, which is a continuation of application Ser. No. 09/477,060 filed 3 Jan. 2000 now U.S. Pat. No. 6,635,873, the contents of which are incorporated herein by reference.

BACKGROUND OF THE INVENTION

The present invention relates to a scanning electron microscope for scanning an electron beam on the surface of an observation sample such as an IC, detecting a secondary signal generated from the sample, whereby obtaining a two-dimensional scanned image indicating the shape or composition of the sample surface.

The scanning electron microscope accelerates electrons emitted from a heating or field emission type electron source, forms a fine electron beam (primary electron beam) using an electrostatic field lens or a magnetic field lens, scans the primary electron beam two-dimensionally on a sample to be observed, detects a secondary signal, such as secondary electrons or reflected electrons, generated secondarily from the sample by irradiation of the primary electron beam, and converts the intensity of the detected signal to an brightness modulation input of the CRT scanned in synchronization with scanning of the primary electron beam, whereby obtains a two-dimensional scanned image.

A general scanning electron microscope accelerates electrons emitted from an electron source with a negative voltage applied between the electron source and the anode at the grounding voltage and scans the primary electron beam on a test sample at the grounding voltage.

When observing the processing shape of a wafer in the semiconductor process by the scanning electron microscope, to prevent the insulator within the wafer from charging by electron scanning, the shape is observed at a low acceleration voltage of 2 kV or less. This relates to the secondary electron generation efficiency δ generated when electrons are irradiated to a substance. In this case, the secondary electron generation efficiency δ is defined by [(secondary electron amount)/(primary electron amount)].

FIG. 1 shows the relationship between the secondary electron generation efficiency δ and the acceleration voltage. When the acceleration voltage (1 kV to 2 kV) when the secondary electron generation efficiency δ becomes almost 1 is selected, electrons entering a sample (incident electrons) and electrons (secondary electrons) coming out from the sample are equal in number and hence generation of charging can be prevented. The acceleration voltage when the secondary electron generation efficiency δ becomes 1.0 is almost 1 to 2 kv though it varies with a substance. At the acceleration voltage when the secondary electron generation efficiency δ is more than 1, discharge of secondary electrons is stronger than incidence of primary electrons, so that the surface of the insulator is positively charged. This positively charged voltage is several volts at most and stable, so that observation of scanned images provides no trouble. However, within the range from 1 kv to 2 kv, the secondary electron generation efficiency δ may not be 1 or more depending on a sample. As a result, an unstable negative charge is generated. Therefore, in the case of observation of a wafer including an insulator by a conventional scanning electron microscope, an acceleration voltage within the range from 500 V to 1000 V which allows the secondary electron generation efficiency δ to exceed 1.0 and sufficiently accelerates the electron beam is selected.

A semiconductor wafer is observed under such a condition, though a big problem in terms of practical use is observation of a deep contact hole.

A contact hole 102 is used to electrically connect a conductive board 103 to wires (not shown in the drawing) formed on the top of an insulator 101. The object of observation of the contact hole is to check the opening of the hole 102 for etching the insulator 101. Unless the conductive board 103 is exposed surely on the bottom of the contact hole 102, even if the contact hole 102 is filled with a metal (deposition), it is a bad conductor which cannot connect with the conductive board 103.

The contact hole is observed by displaying the condition of the contact hole 102 formed in the insulator 101 provided on the board 103 on the display screen of the scanning electron microscope. As shown in FIG. 14A, when the contact hole 102 perfectly reaches the board 103, the bottom of the contact hole 102 clearly shows the shape of a bottom B and it is observed that the good contact hole 102 is formed. However, as shown in FIG. 14B, when the contact hole 102 does not perfectly reach the board 103 and there are residues on the bottom, the bottom of the contact hole 102 is observed as a shadow 102B.

In such an observation, as shown in FIG. 2, a large part of secondary electrons 104 generated at the bottom of the contact hole 102 collides with the wall of the hole 102 and disappears and only a part of secondary electrons 104a emitted upward gets out of the hole. When the contact hole is shallow (the aspect ratio<1 to 2), although signals are reduced, a considerable part of secondary electrons gets out of the hole 102, so that the hole can be observed. However, when refinement advances like recent semiconductor devices and the aspect ratio is more than 3, it is impossible to observe the bottom of the contact hole. As an example of difficult observation by such a conventional scanning electron microscope as shown in U.S. Pat. No. 5,412,209, for example, a sample example shown in FIG. 3 may be cited.

When a sample that metal wires 105, for example, aluminum wires are embedded in the insulator 101 is observed at a low acceleration voltage causing no charging, as mentioned already, the surface of the insulator is charged positively and stably by balancing of secondary electrons. Therefore, even if the internal wires 105 are provided, the scanning electron microscope cannot observe the existence thereof.

SUMMARY OF THE INVENTION

The present invention has been developed to eliminate the difficulties of the prior arts mentioned above and is intended to provide a scanning electron microscope for observing the bottom of a contact hole formed on an observation sample such as an IC and internal wires.

The object of the present invention can be accomplished by scanning a sample at the predetermined acceleration voltage before starting observation of the sample, giving the surface charge desirable for observation to the insulator surface of the sample, and then scanning and observing the charged surface of the sample at an acceleration voltage different from the aforementioned acceleration voltage.

Furthermore, the object of the present invention is accomplished by positively charging the insulator surface of the sample which is desirable for observation and then scanning and observing the surface of the positively charged sample at an acceleration voltage different from the aforementioned acceleration voltage. Concretely, the object of the present invention is accomplished when the first acceleration voltage is within the range from 500 V to 1 kV and the second acceleration voltage at the time of image observation is within the range from 1 to 2 kV.

Furthermore, the object of the present invention is accomplished by negatively charging the insulator surface of the sample which is desirable for observation and then scanning and observing the surface of the negatively charged sample at an acceleration voltage different from the aforementioned acceleration voltage. Concretely, the object of the present invention is accomplished when the first acceleration voltage is 2 kV or more and the second acceleration voltage at the time of image observation is within the range from 1 to 2 kV.

Furthermore, the object of the present invention is accomplished when the first acceleration voltage is within the range from 500 V to 1 kV and the second acceleration voltage at the time of irradiation of an electron beam is within the range from 20 to 30 V.

DETAILED DESCRIPTION OF THE PREFERRED EMBODIMENT

The embodiment of the present invention will be explained concretely with reference to the accompanying drawings. Firstly, a scanning electron microscope for observing the bottom of a contact hole will be explained.

Figure 2:
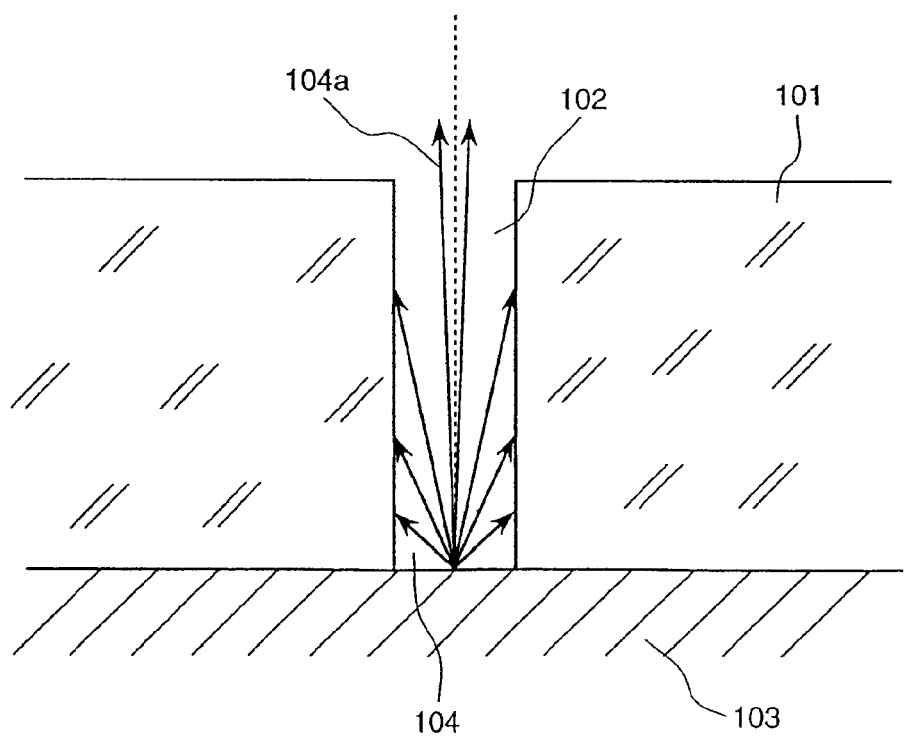
FIG. 2 is a drawing for explaining a collision of secondary electrons in a deep contact hole.
Figure 4:
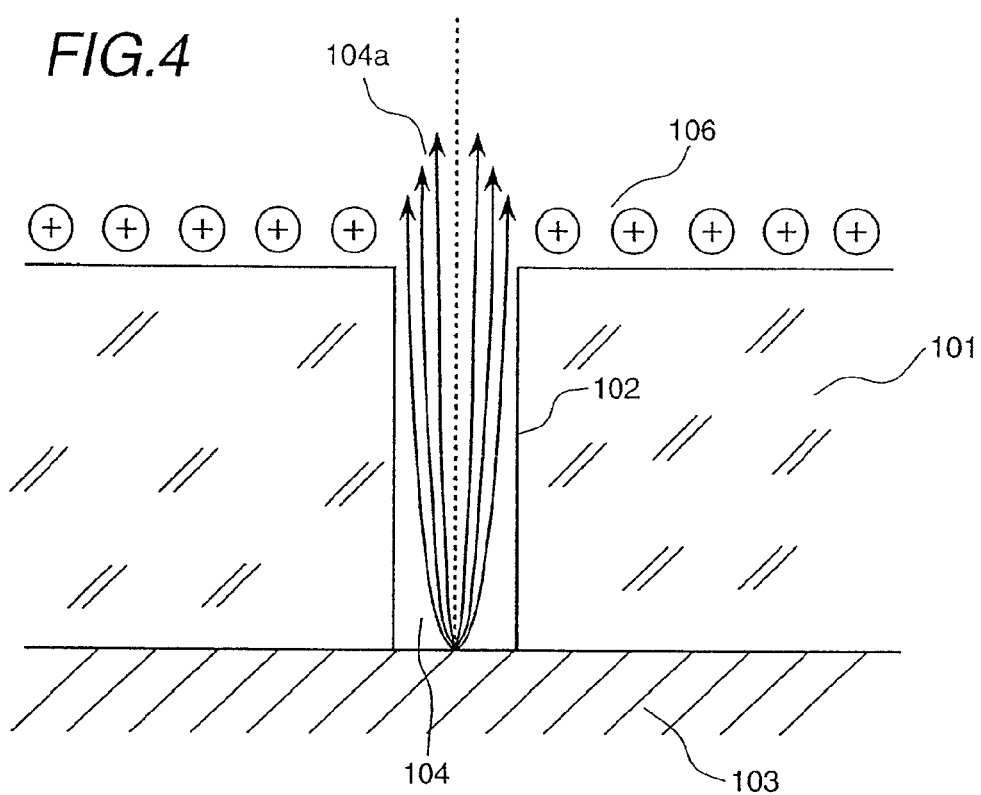
FIG. 4 is a drawing for explaining a positive charge for allowing observation of a high aspect hole.

For example, in observation of a high aspect hole shown in FIG. 2, as shown in FIG. 4, a positive charge 106 is given to the surface of the insulator 101. By doing this, a strong electric field (for example, when a charge of 1 V is generated, an electric field of 1 V/1 μm=10 kV/cm) is formed between the conductive board 103 and the surface of the insulator 101 and secondary electrons 104 generated at the bottom of the hole 102 are focused by the electric field as shown in the drawing and ejected outside from the opening of the hole 102.

Figure 1:
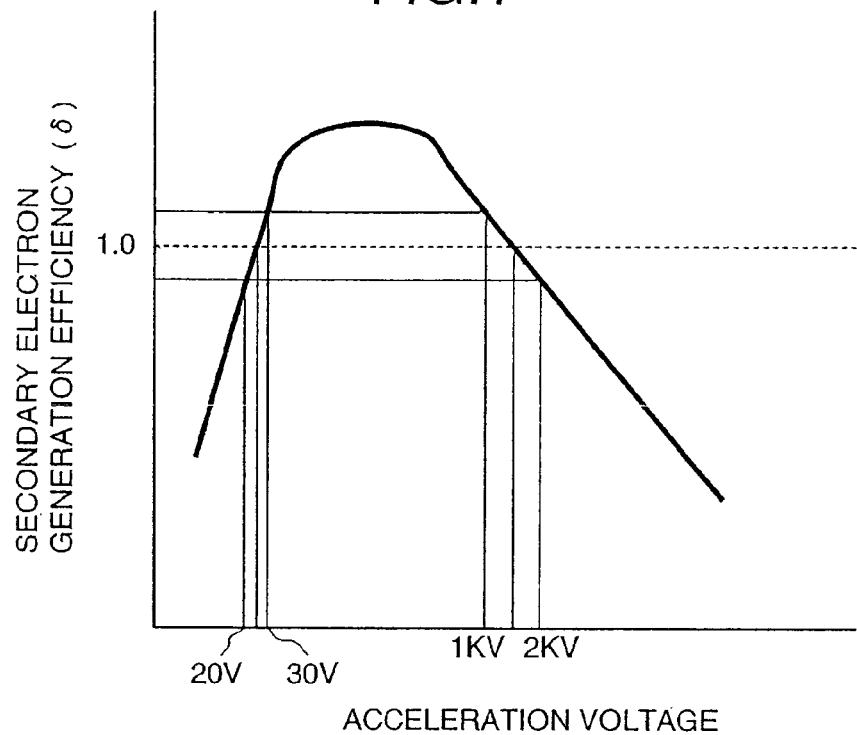
FIG. 1 is a drawing for explaining the dependence on acceleration voltage of the secondary electron generation efficiency $\delta$.

However, it is made possible to give a positive charge to the surface of the insulator 101 by selecting an acceleration voltage area for proving a secondary electron generation efficiency $\delta$ of more than 1 shown in FIG. 1. When an acceleration voltage for maximizing the secondary electron generation efficiency $\delta$ is selected, the highest positive voltage can be given. However, the acceleration voltage for maximizing the secondary electron generation efficiency $\delta$ is generally low such as several hundreds volt, so that it is difficult to obtain a resolution which can be satisfied as observation.

Figure 5:
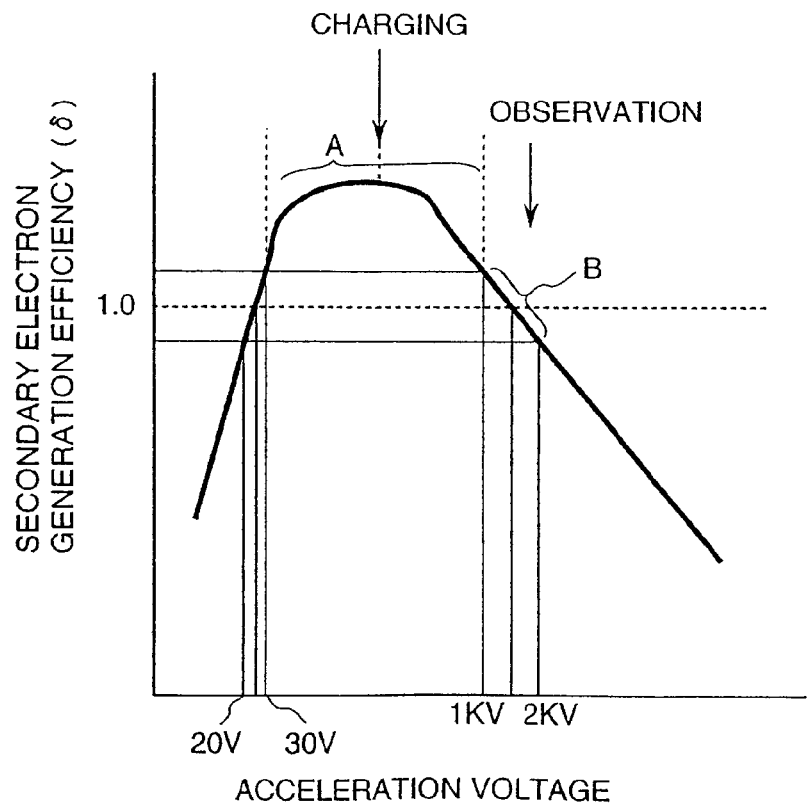
FIG. 5 is a drawing for explaining the relationship between the acceleration voltage for positively charging, acceleration voltage for observations and secondary electron generation efficiency.

Therefore, according to the present invention, at the acceleration voltage (the area A shown in FIG. 5) for maximizing the secondary electron generation efficiency $\delta$, electrons are irradiated (charged) in a fixed area for a given period of time and then the contact hole is observed at the acceleration voltage of observation (the area B shown in FIG. 5). By this operation, positive charging and observation with high resolution can be made consistent with each other. For the area B, when the acceleration voltage for providing a secondary electron generation efficiency close to 1.0 is selected, the positive charge formed by irradiation of electrons can be held for many hours. As a result, a distinct image of the bottom of a contact hole with a high aspect ratio is displayed and the bottom can be observed.

Figure 6:
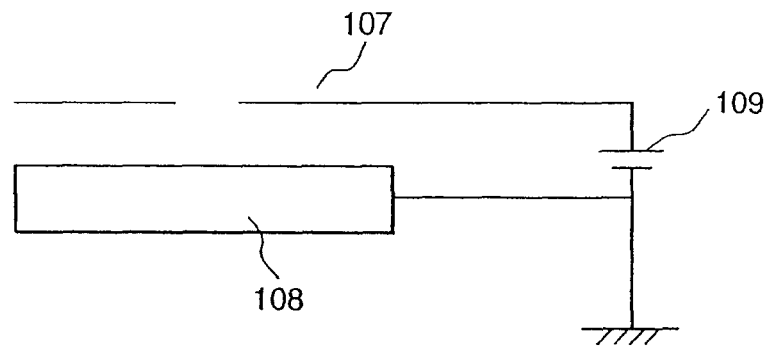
FIG. 6 is a drawing for explaining a facing electrode for facing a sample.

Next, to charge a higher positive voltage to the insulator, for example, the resist surface coated on a semiconductor wafer, as shown in FIG. 6, there is a method for installing a facing electrode 107 facing a sample 108 and applying a positive voltage to it. This is based on the principle that at a low acceleration voltage, a positive charge is generated on the surface of an insulator so that the secondary electron discharge ratio becomes 1.0 and as the positive voltage of the facing electrode 107 increases, the charged voltage of the surface of the insulator increases. Therefore, the facing electrode 107 is provided facing the sample at the time of the charging operation and a positive voltage is applied to it from a facing electrode power source 109. By doing this, the surface of the sample 108 is charged at a higher positive voltage and the effect of observation can be increased.

Figure 3A:
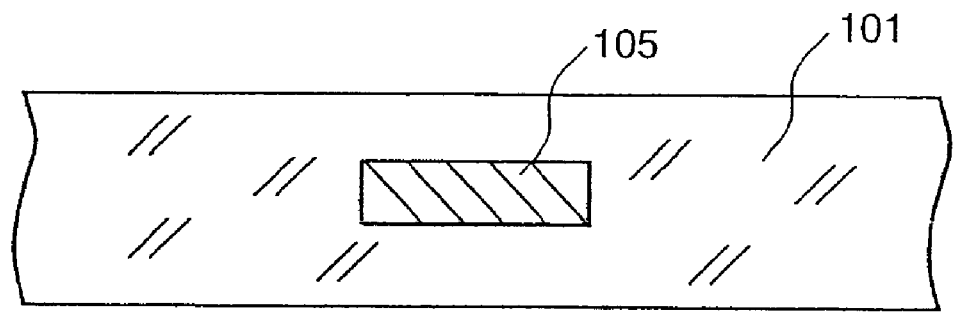
FIG. 3A is a cross sectional view for explaining wires in an insulator and FIG. 3B is a top view of FIG. 3A.
Figure 3B:
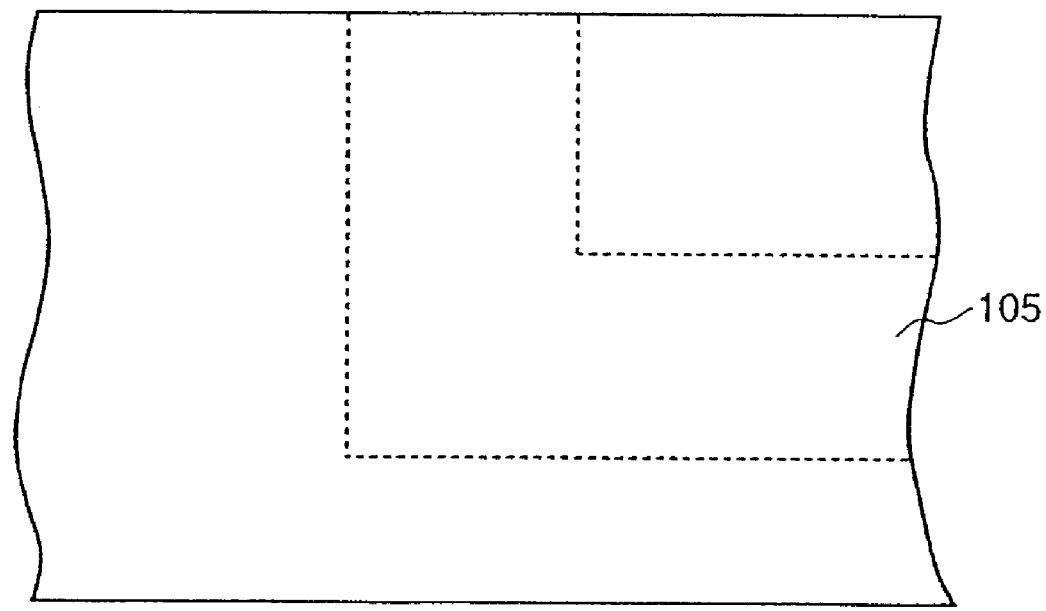

To make it possible to observe wires formed inside an observation sample such as an IC as shown in FIG. 3, the acceleration voltage is set to a value so that the secondary electron discharge ratio becomes 1.0 or less. For example, it is assumed to be set to 5 kV. At an acceleration voltage of 5 kV, electrons enter inside the insulator 101 to a depth of 0.3 to 0.4 μm.

Figure 7:
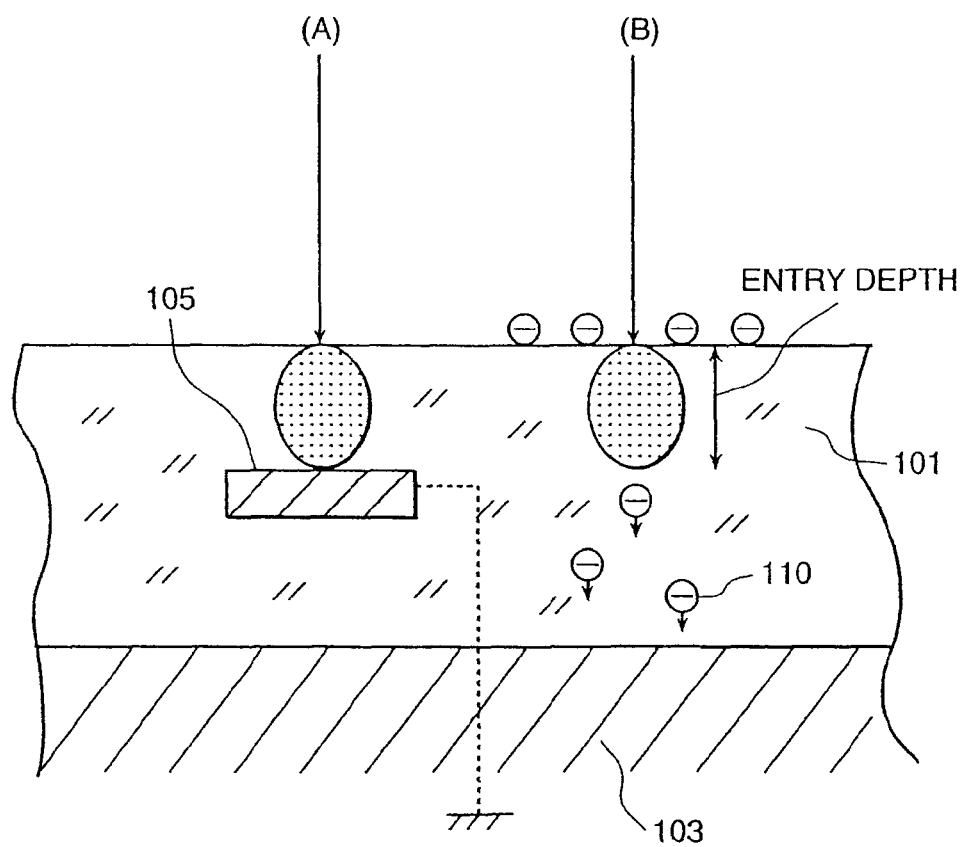
FIG. 7 is a drawing for explaining the condition when an electron beam at an acceleration voltage of 5 kV is irradiated to wires in an insulator.

FIG. 7 schematically shows the situation that electrons enter inside the insulator 101. The thickness of the insulator 101 used in a semiconductor is about 1 μm. The depth from the surface to the wires 105 is about 0.4 μm and as shown in the area A, at the part where the internal wires 105 are provided, radiated electrons reach the wires 105. When the acceleration voltage is 5 kv, the secondary electron discharge ratio is 1.0 or less, so that the surface of the insulator 101 is negatively charged. As shown in the area (B), an electric field is applied between the surface of the insulator 101 and the conductive board 103 by the voltage charged on the surface, and electrons 110 of paired positive holes generated by entry of electrons flow toward the board 103 by the electric field, and the charged voltage is suppressed. Namely, a charged voltage at which the irradiated electron amount and the electron amount flowing the insulator 101 are balanced is obtained.

As shown in FIG. 7, the part of the area (A) where the internal wires 105 are provided includes many paired positive holes of electrons because radiated electrons reach the wires 105 and the charged voltage is low. On the other hand, the part of the area (B) where no internal wires are provided includes few paired positive holes of electrons because radiated electrons do not reach the board 103 and the charged voltage is high. This voltage varies with the irradiation time and area. After this charging process is performed, when the contact hole is observed at a low acceleration voltage (the condition of the area B shown in FIG. 5), the contrast due to a difference in the charged voltage can be observed. The part of the area (A) can be observed dark and the part of the area (B) can be observed bight.

Figure 8:
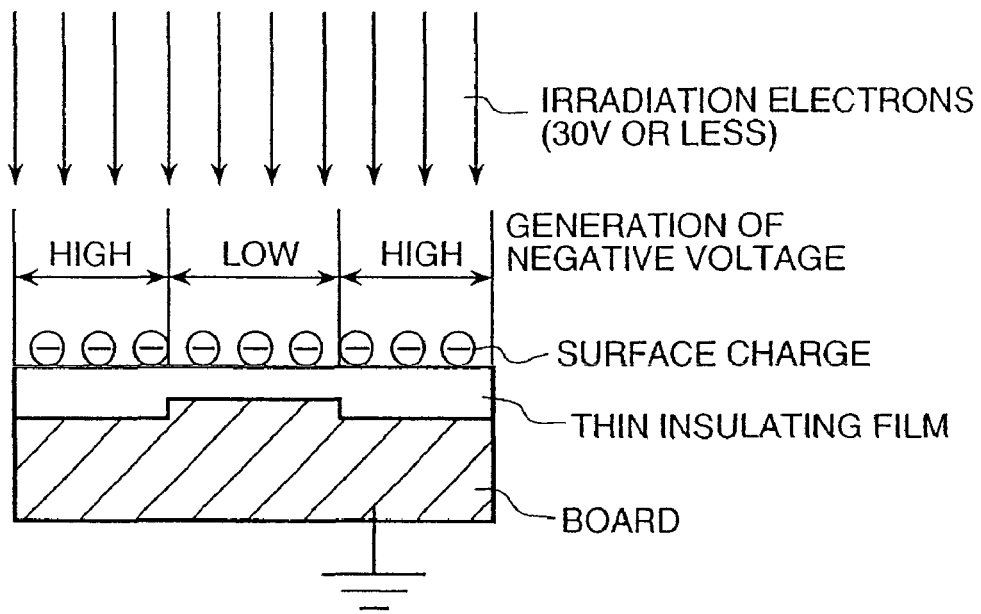
FIG. 8 is a drawing showing the situation of charging when electrons accelerated at 30 V or less are irradiated to an insulating thin film sample.

In the example shown in FIG. 7, as a method for forming a negative charge, an acceleration voltage more than 2 kV is selected. However, it is also possible to select an acceleration voltage of 30 V or less for obtaining a secondary electron generation ratio δ of 1 or less. At an acceleration voltage of 30 V or less, the electron energy is low, so that radiated electrons do not enter the sample but stop on the sample surface and give a negative charge to it. FIG. 8 shows the situation of negative charge of the surface when electrons accelerated at 30 V or less are radiated to a sample of thin insulating film for a fixed period of time. By irradiation of electrons, a fixed amount of charge is accumulated on the surface (strictly speaking, the amount is not proportional to the irradiation time, though when the surface voltage is several volt or less, it may be considered to be proportional). When the thickness of thin insulating film is different as shown in the drawing, the voltage V (negative) generated by accumulation of charge (Q) is Q/C (where C indicates an electrostatic capacity generated by the thin film between the surface and the board and C=ϵ*S/d), so that the voltage at a thick portion is low.

Figure 9:
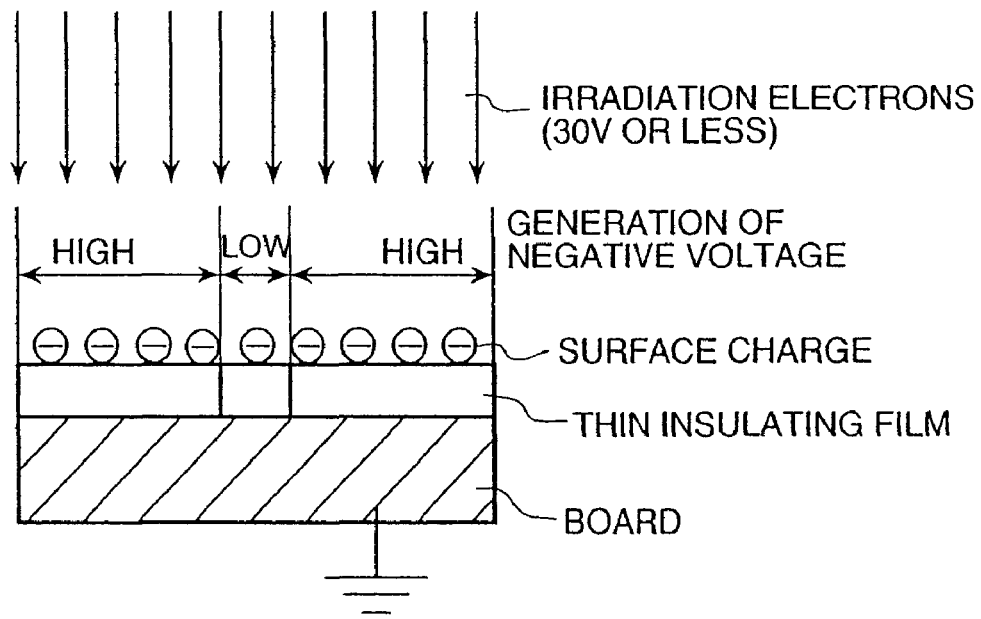
FIG. 9 is a drawing showing the situation of charging when electrons accelerated at 30 V or less are irradiated to an insulating thin film sample.

After this process, when observed at a low acceleration voltage (the condition B shown in FIG. 5), the voltage difference of the surface of the thin insulating film can be observed. Namely, the internal information can be obtained though it cannot be seen from the surface. When the observation is continued, the negative voltage difference is stabilized to a positive voltage generated by the low acceleration voltage (the condition B shown in FIG. 5) because the surface charge is neutralized and then disappears. Since the surface is negatively charged, the difference from the stable voltage is increased and moreover, the time until disappearance can be lengthened. Here, that the difference in the thickness of thin insulating film can be seen is explained. However, when there is a defect (defective insulation) in the thin insulating film as shown in FIG. 9, no charge is accumulated only in the portion, so that the defect of the thin insulating film can be observed as a voltage difference. When 5 kV is selected as an acceleration voltage, there is the possibility that a semiconductor element may be damaged by the electron energy. However, at an acceleration voltage of 30 kV or less, no problem of damage is caused.

As another method for generating a negative charge, a method for giving a negative voltage to the sample 108 for the facing electrode 107 explained in FIG. 6 is also available. The principle, as mentioned above, is balancing of primary electrons and secondary electrons and since the facing electrode 107 is applied with a negative voltage, it is balanced by applying a negative voltage to the surface of the sample 108.

As mentioned above, according to the present invention, by positively using the charge of the surface of an insulator, the status of the bottom of the contact hole and wires inside the sample which cannot be observed conventionally can be observed.

When the aforementioned is summarized, a scanning electron microscope according to the present invention for scanning a sample with an accelerated electron beam, detecting secondary electrons generated from the sample or reflected electrons or both of them, and forming images is characterized in that the electron microscope has a function for radiating electrons to the sample at the first acceleration voltage and then observing scanned images at the second acceleration voltage different from the first acceleration voltage.

A scanning electron microscope according to the present invention for scanning a sample with an accelerated electron beam, detecting secondary electrons generated from the sample or reflected electrons or both of them, and forming images is characterized in that the electron microscope includes a voltage application means for applying a voltage to the sample and has a function for radiating electrons in the state that the first voltage is applied to the sample by the voltage application means and then applying the second voltage different from the first voltage to the sample and observing images.

A scanning electron microscope according to the present invention for scanning a sample with an accelerated electron beam, detecting secondary electrons generated from the sample or reflected electrons or both of them, and forming images is characterized in that the electron microscope includes a first voltage application means for applying a voltage to the sample and a second voltage application means for applying a voltage to the facing electrode facing the sample and has a function for radiating electrons to the sample by applying a voltage by the first voltage application means and/or the second application means and then applying a voltage different from the aforementioned voltage for radiating electrons by the first voltage application means and/or the second application means and observing images.

It is desirable that the electron beam acceleration voltage for observing images is 2 kv or less. The electron beam acceleration voltage for radiating electrons can be set to a value sufficient to pass through an insulating film covering the internal structure of a sample to be observed. When a sample is observed after radiating electrons under such a condition, the internal structure of the sample, for example, the internal wires can be observed.

The electron beam acceleration voltage for radiating electrons can beset to 30 V or less. When a sample is observed after radiating electrons under such a condition, the thickness distribution and defects of a thin insulating film can be detected.

At the time of irradiation of electrons, so as to set the sample voltage to a positive voltage for the facing electrode facing the sample or the under surface of the object lens, the application voltage of the sample or the voltage of the facing electrode may be controlled.

A scanning electron microscope according to the present invention including an electron source, a scanning deflector for scanning the primary electron beam generated from the electron source on a sample, an object lens for focusing the primary electron beam, a voltage application means for forming a speed reduction field for the primary electron beam between the object lens for applying a negative voltage to the sample and the sample, and a secondary signal detector arranged between the electron source and the object lens for detecting a secondary signal from the sample is characterized in that the electron microscope has a function for applying the first voltage to the sample by the voltage application means, scanning the primary electron beam on the sample at the first acceleration voltage, then applying the second voltage different from the first voltage to the sample by the voltage application means, and scanning the primary electron beam on the sample at the second acceleration voltage, and observing sample images.

A scanning electron microscope according to the present invention including an electron source, a scanning deflector for scanning the primary electron beam generated from the electron source on a sample, an object lens for focusing the primary electron beam, and a secondary signal detector for detecting a secondary signal generated from the sample by irradiation of the primary electron beam so as to obtain two-dimensional scanned images of the sample is characterized in that the electron microscope has an acceleration cylinder arranged in the electron beam path of the object lens, a first voltage application means for applying the after-acceleration voltage of the first electron beam to the acceleration cylinder, and a second voltage application means for applying a negative voltage to the sample and has a function for performing a process of applying a voltage by the first voltage application means and the second voltage application means and scanning the sample, then applying a voltage different from the voltage when the aforementioned process is performed by the first voltage application means and the second voltage application means, scanning the sample, and obtaining two-dimensional scanned images of the sample.

The aforementioned scanning electron microscope has a blanking means composed of a deflector and an aperture for interrupting an electron beam deflected by the deflector in the path of the electron beam and by using the blanking means, can control interruption of the electron beam during the period until the first acceleration voltage is set, the electron irradiation time, and interruption of the electron beam during the period until the second acceleration voltage is set. The deflector may be an electrostatic system or electromagnetic system.

In the aforementioned scanning electron microscope, it is desirable that irradiation of the electron beam and setting of the second acceleration voltage are automatically executed by a program describing the operation conditions and operation sequence. The operation conditions include, for example, the magnitude of the first sample voltage, the time and area of irradiation of electrons, the magnitude of the second sample voltage, and scanned image observation conditions and the operation sequence is a series of processes including, for example, application of the first sample voltage, blanking control, irradiation of electrons, application of the second sample voltage, setting of observation conditions, observation of images, and recording.

The scanning electron microscope of the present invention is preferable to have a function for inputting information on the position on a sample which is obtained by another device and automatically moving a sample stage for holding the sample on the basis of the aforementioned information. The sample stage may be provided as a sample stage whose position is controlled by a laser beam or a linear sensor and the means for inputting information obtained by another device may be data communication via a communication cable or information input using a storage medium.

The scanning electron microscope is also preferable to have a function for recording scanned images at each sample position and sorting and displaying recorded scanned images.

The embodiment of the present invention will be explained hereunder with reference to the accompanying drawings.

Figure 10:
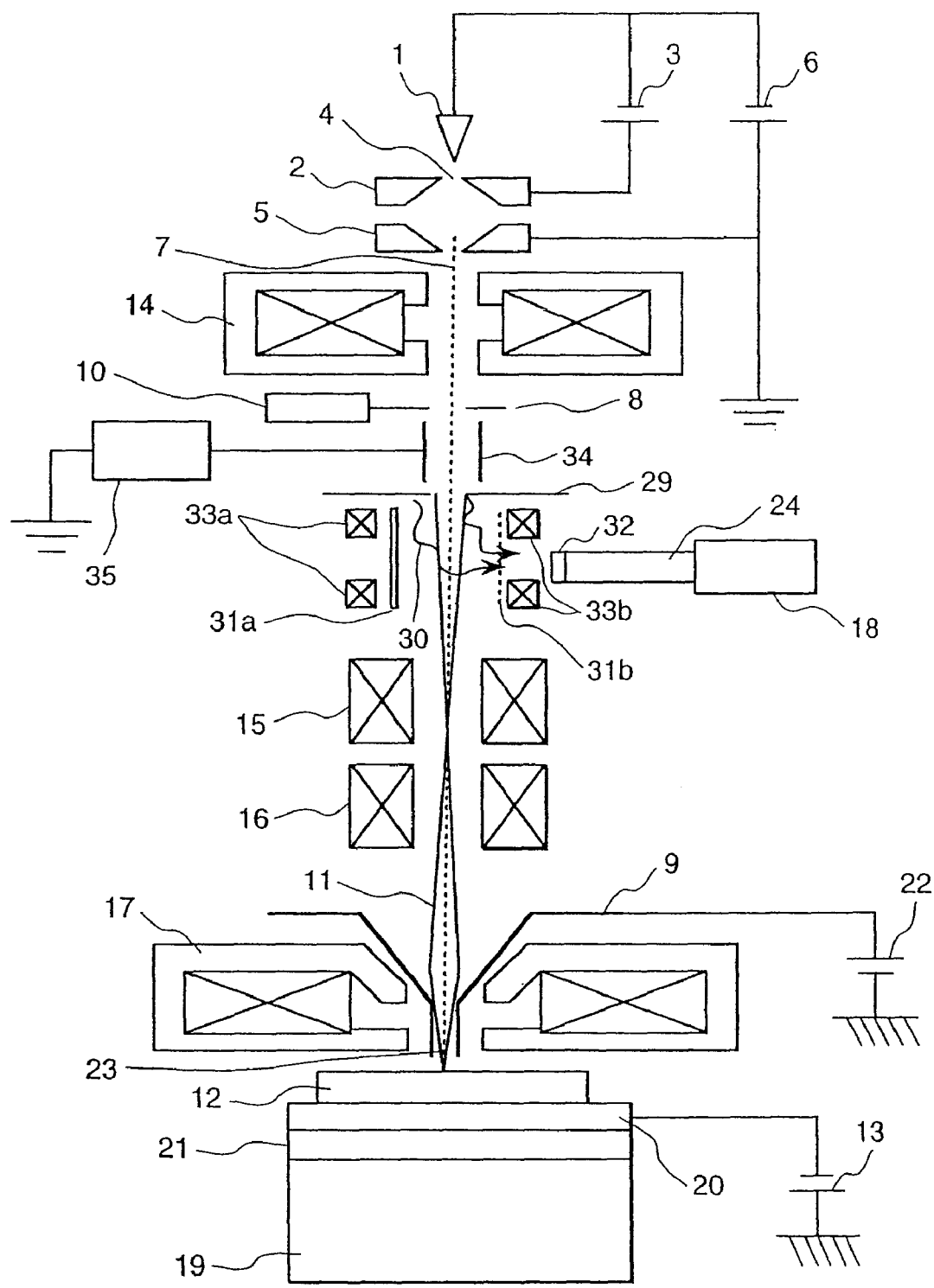
FIG. 10 is a schematic view of a scanning electron microscope of a retarding system.

FIG. 10 is a schematic view of a scanning electron microscope of a typical retarding system. The object of the present invention is to radiate an electron beam onto a sample at an acceleration voltage different from the acceleration voltage for observation, give a necessary charge to the sample surface, and then execute observation. To change the acceleration voltage of the electron beam to be radiated to the sample, needless to say, the general method for changing the acceleration voltage of electrons emitted from an electron gun is acceptable. However, a scanning electron microscope of a retarding system is suitable for execution of the present invention, so that an embodiment using a scanning electron microscope of a retarding system will be explained hereunder.

When a voltage from an extraction voltage source 3 is applied between a field emission cathode 1 and an extraction electrode 2, emission electrons 4 are emitted. The emission electrons 4 are more accelerated (there is a case of deceleration) between the extraction electrode 2 and an anode 5 at the grounding voltage. The acceleration voltage of an electron beam (primary electron beam) 7 passing the anode 5 coincides with the voltage from an electron gun acceleration voltage source 6.

The primary electron beam 7 accelerated by the anode 5 is deflected in scanning by a capacitor lens 14, an upper scanning deflector 15, and a lower scanning deflector 16. The deflection strengths of the upper scanning deflector 15 and the lower scanning deflector 16 are adjusted so as to two-dimensionally scan on a sample 12 using the center of an object lens 17 as a fulcrum. The deflected primary electron beam 7 is further accelerated by the voltage from an after-acceleration voltage source 22 at an acceleration cylinder 9 provided in the path of the object lens 17. The primary electron beam 7 accelerated at the latter stage is limited narrowly on the sample 12 by the lens action of the object lens 17. The primary electron beam 7 passing the object lens 17 is decelerated in a speed reduction field generated between the object lens 17 and the sample 12 by the voltage from a negative retarding voltage source 13 applied to the sample 12 and reaches the sample 12.

By use of this constitution, the acceleration voltage of the primary electron beam 7 when it passes the object lens 17 is (the voltage from the electron gun acceleration voltage source 6)+(the voltage from the after-acceleration voltage source 22) and it is higher than the acceleration voltage "(the voltage from the electron gun acceleration voltage source 6)−(the voltage from the retarding voltage source 13)" entering the sample 12. As a result, compared with a case that the primary electron beam "(the voltage from the electron gun acceleration voltage source 6)−(the voltage from the retarding voltage source 13)" itself of the acceleration voltage entering the sample is limited by the object lens 17, a narrower electron beam (high resolution) is obtained. The reason is that the color aberration of the object lens 17 reduces. In a typical example, the voltage from the electron gun acceleration voltage source 6 is assumed as 2 kV, the voltage from the after-acceleration voltage source 22 as 7 kV, and the voltage from the retarding voltage source 13 as 1 kV. In this example, the primary electron beam 7 passes inside the object lens 17 at 9 kV and the acceleration voltage entering the sample is 1 kV. The resolution in this example, compared with the resolution 10 nm when the primary electron beam of 1 kV itself is limited, is improved to 3 nm which is about ⅓.

When the primary electron beam 7 is radiated to the sample 12, a secondary signal 11 is generated. The secondary signal 11 to be considered here is secondary electrons and reflected electrons. The electric field generated between the object lens 17 and the sample 12 operates as an acceleration filed for the generated secondary signal 11, so that it is extracted within the path of the object lens 17 and moves up under the lens operation in the magnetic field of the object lens 17. The secondary signal 11 passing the object lens 17 passes the scanning deflectors 15 and 16 and collides with a reflection plate 29. The reflection plate 29 is a conductive plate having an opening through which the primary electron beam 7 passes at the center thereof. The surface with which the secondary signal 11 collides is a deposited surface of a substance having a high secondary electron generation efficiency, for example, gold. Secondary electrons and reflected electrons of the secondary signal 11 collide with the reflection electron plate 29 after passing almost the same orbital path.

Secondary electrons and reflected electrons colliding with the reflection plate 29 generate secondary electrons 30 here. The secondary electrons 30 generated by the reflection plate 29 are deflected by an electrostatic deflection electrode 31a applying a negative voltage to the ground and an electrostatic deflection electrode 31b applying a positive voltage to the ground. The electrostatic deflection electrode 31b is meshed so that the deflected secondary electrons 30 can pass through it. Numerals 33a and 33b indicate magnetic field deflection coils, which generate magnetic fields orthogonal to the electric fields generated by the electrostatic deflection electrodes 31a and 31b and cancel deflection of the primary electron beam 7 due to electrostatic deflection. Secondary electrons passing the meshed electrostatic deflection electrode 31b are attracted by a scintillator 32 to which a positive high voltage of 10 kV (not shown in the drawing) is applied, collide with the scintillator 32, and emit light. The light is led to a photomultiplier tube 18 by a light guide 24, converted to an electric signal, and amplified. The brightness of the CRT is modulated by this output (not shown in the drawing).

In this embodiment, for example, a method for giving a positive charge to the surface of an insulator and observing the contact hole will be explained. As mentioned already, the acceleration voltage for observation (the second acceleration voltage) is 1 kV (electron gun acceleration voltage 2 kV−retarding voltage 1 kV). The first acceleration voltage is set to an acceleration voltage for obtaining a maximum secondary electron emission ratio, for example, 300 V. In this case, the voltage from the retarding voltage source 13 of 1000 V is set to 1700 V.

In a general scanning electron microscope of low acceleration using no retarding voltage, the contact hole is observed at an electron gun acceleration voltage of 1 kV and the charging process is performed at 300 V. According to this method, when the charging process is to be performed, the strengths of the capacitor lens 14 and the object lens 17 are fit to 300 V different from that for image observation. It is also necessary to fit the strengths of the scanning coils 15 and 16 to it. Particularly, when the electron gun acceleration voltage is low such as 300 V, it is also difficult to lead electrons to the sample 12.

On the other hand, the method using retardation requires no adjustment of the optical system including the lenses only by changing the voltage from the retarding voltage source 13. The change in the scanning magnification is small. Namely, according to this embodiment, the charging process can be executed only by increasing the voltage from the retarding voltage source 13 from 1000 V to 1700 V. Irradiation of electrons requires no focusing, so that when the retarding voltage is set to 1700 V, and irradiation is executed in a fixed area (magnification) for a fixed period of time, and then the retarding voltage is returned to 1000 V, focused observation which can see inside the hole can be executed again.

To charge a negative voltage for observation of the internal wires, the voltage (retarding voltage) to be applied to the sample 12 is converted to a positive electrode and for example, a positive voltage of 3 kV is applied. By doing this, the acceleration voltage becomes 5 kV and a negative voltage can be charged on the insulator surface. When the process of charging of a negative voltage is performed in a fixed area of the sample for a fixed period of time and then the retarding voltage is returned to its original value, the internal wires can be observed.

According to this embodiment, the electric field in the direction of extracting secondary electrons from the sample 12 is applied. However, to promote negative charging more, it is also effective to apply an electric field for returning secondary electrons to the sample. For example, although a positive voltage is applied to the sample for negative charging, in this case, the after-acceleration voltage is set to a negative voltage, for example, 1200 V. As a result, a reverse field, that is, an electric field in the direction of returning secondary electrons to the sample is applied to the sample and as mentioned above, negative charging is promoted. Furthermore, by setting the retarding voltage to 1970 V (negative electrode) and setting the acceleration voltage to 30 V, negative charging can be generated.

In FIG. 10, with respect to a limiting device 8 for controlling the opening angle of the primary electron beam 7, axial consistency can be realized by an adjusting knob 10. Numeral 19 indicates an XY moving mechanism for moving the sample 12 in the XY direction, and a holder 20 insulated by an insulating plate 21 is put on it, and the voltage from the retarding voltage source 13 is applied to it. The sample (for example, a wafer) 12 is put on the holder 20. When the sample 12 is put on it, electric contact is provided and the retarding voltage 13 is also applied to the sample 12. Numeral 34 indicates a blanker, and when a blanking voltage 35 is applied to it, the electron beam 7 is deflected and collides with the limiting device 8, and the electron beam cannot reach the sample. According to the present invention, the blanking is very effective and as explained hereunder, it is possible to stop irradiation of electrons during the time of condition setting and execute irradiation of electrons only during the time necessary for irradiation and observation.

Figure 11:
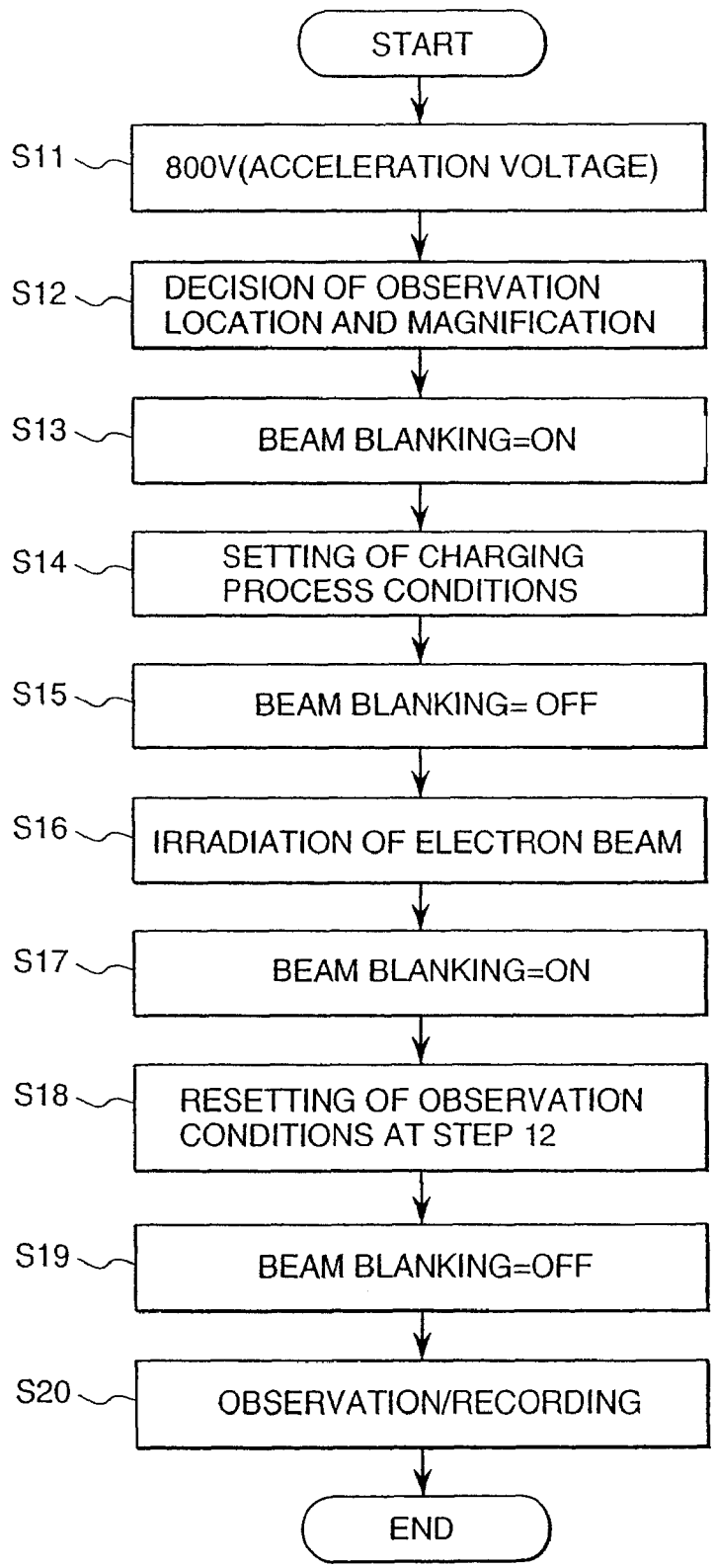
FIG. 11 is a flow chart for explaining an example of the observation method using the charging operation.

Next, the observation method using the charging operation in this embodiment and using the scanning electron microscope shown in FIG. 10 will be explained by referring to the flow chart shown in FIG. 11. An example that a hole is observed at an acceleration voltage of 800 V will be explained hereunder. By operating the electron gun acceleration voltage source 6 and the retarding voltage source 13 shown in FIG. 10, the electron beam optical system is adjusted (focussing, etc.) at the acceleration voltage 800 V (S11), and the XY moving mechanism 19 is operated by looking at a scanned image of the sample, and observation parts are decided, and the observation magnification is decided by operating the upper scanning deflector 15 and the lower scanning deflector 16 (S12).

In this case, images are saved in the storage device (image A) as required. Thereafter, the beam is stopped (blanking) by turning the beam blanking ON by the blanker 34 (S13) and the charging process conditions such as the acceleration voltage for charging and the electron beam irradiation time are set (S14). For example, the irradiation time is set to 10 seconds at an acceleration voltage of 300 V (in this embodiment, the retarding voltage is set to 1700 V) and a magnification of 1000 times. After completion of the setting, the beam blanking is turned OFF by the blanker 34 and the charging process is performed by radiating the electron beam under the preset conditions (S16). When the charging process is finished, the beam blanking is turned ON again (S17). Next, the procedure is returned to the observation conditions at Step 12 (S18), and the beam blanking is turned OFF (S19), and image observation and images are recorded (image B) (S20). When the duration time of charging effect is short or in the case of automatic operation, images may be recorded without observation. Using the image B, shape observation and size measurement are executed. However, by performing arithmetic (addition, subtraction) with the image A, changes are detected and errors in the processing structure and defects in the shape can be decided. Thereafter, the procedure moves to a new observation part again and the same operation is repeated. When this series of operations is stored as a program, it can be operated by the button operation as an instruction or as one program in the system.

Figure 12:
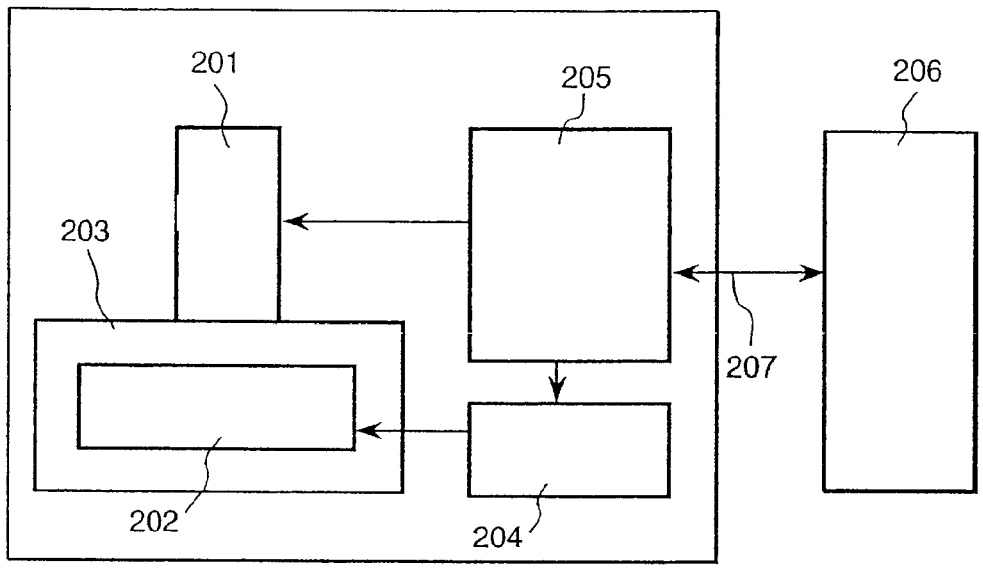
FIG. 12 is a drawing showing a connection example of a scanning electron microscope of the present invention with another device.

Observation parts on a sample by the scanning electron microscope of the present invention may be decided by defective position data obtained by the defect check device using light and electrons. FIG. 12 shows an connection example of the scanning electron microscope of the present invention with another device such as a defective device. The constitution of the apparatus of the present invention is indicated inside the dashed line and it comprises a sample chamber 203 including an electron beam mirror 201 and a laser stage 202, a stage control unit 204 for controlling the laser stage 202, and a body control unit 205 for controlling the whole. An example of laser control is indicated here, though a linear scaler may be used. A necessary condition for the stage in this case is that it has a function for moving to the precisely designated part by designating an address. The apparatus of the present invention is connected to another device 206, for example, a semiconductor pattern defective device of an optical microscope via a communication path 207 and can receive and transmit information of address data and others. The address data obtained from another device 206 may be recorded in a storage medium without using the communication path and transmitted and fetched into the apparatus of the present invention from the storage medium.

Figure 13:
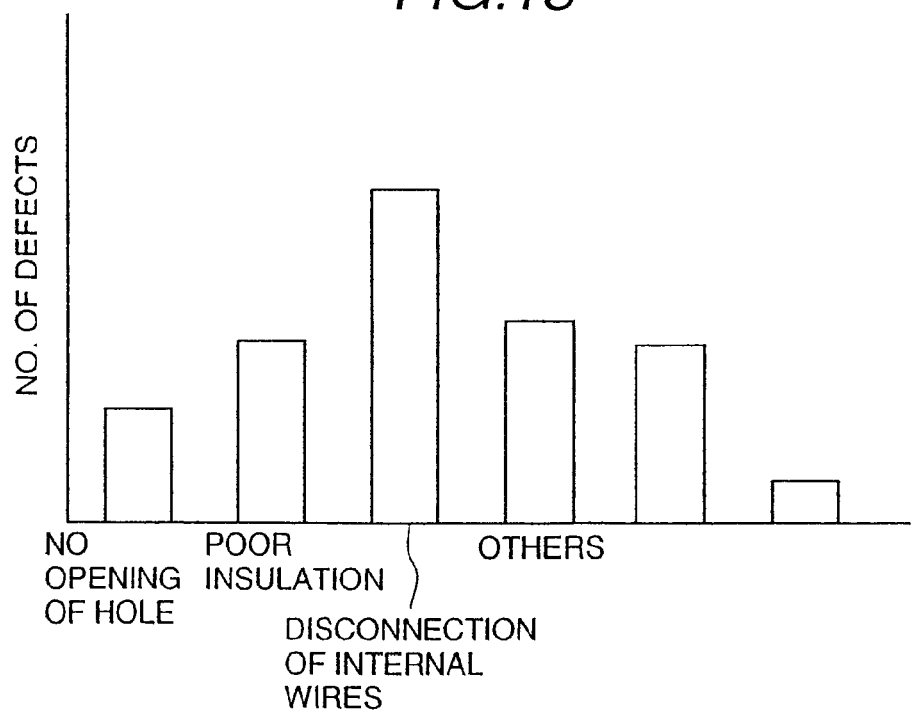
FIG. 13 is a drawing showing detected defects which are sorted and displayed.
Figure 14A:
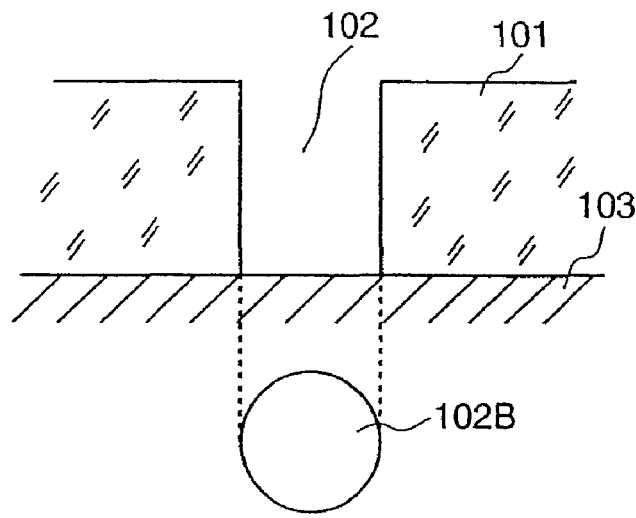
FIGS. 14A and 14B are illustrations for observed images at the bottom of a contact hole.
Figure 14B:
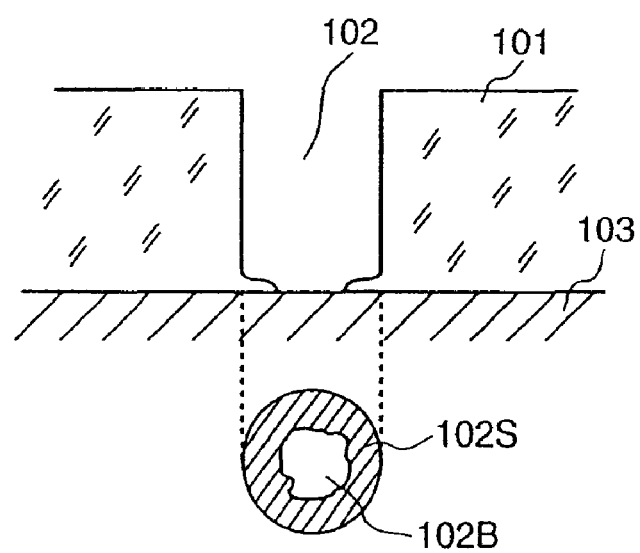

The apparatus of the present invention, on the basis of the address indicating the defective position discovered by another device 206, observes the part. There are generally many parts to be observed, so that the check is often executed automatically. The check results are classified in size and shape and when the electron irradiation operation which is a function of the apparatus of the present invention is used, depending on that the parts can be observed by the negative charging process, or that the parts can be observed by the positive charging process, or the acceleration voltage for irradiation, regarding a detected defect, important information such as an internal defect of the sample, not opening of the hole, or poor insulation can be obtained. These kinds of information are automatically classified depending on the kind of a defect and displayed on a display unit such as a monitor. FIG. 13 shows an example of such classification, and the ordinate axis indicates the number of defects, and the transverse axis indicates the type of a defect. The semiconductor process, with reference to this defect classification, quickly identifies the occurrence part (device) of a defect, takes a countermeasure for it, and prevents a reduction in the yield rate and improvement of the process is attempted continuously.

As mentioned above, according to the present invention, new uses of a scanning electron microscope at a low acceleration voltage can be created such that the bottom of a hole and internal wires which cannot be observed by a scanning electron microscope at a low acceleration voltage can be observed, and parts which cannot be observed so far can be measured, and furthermore a hidden process defect is discriminated.

What is claimed is:

1. A scanning electron microscope, comprising:
   an electron source;
   a deflector for scanning an electron beam emitted from said electron source,
   a detector for detecting electrons generated from a sample, and
   a negative voltage adding source for adding a negative voltage on said sample;
   said scanning electron microscope comprising the steps of:
      controlling said negative voltage so that a first irradiation energy has a secondary electron generation efficiency δ higher than 1.0, said secondary electron generation efficiency δ being defined by (secondary electron amount generated from substance forming a surface of said sample)/(primary electron amount irradiated to said substance), and
      after charging an insulation area including said contact hole into positive by scanning said sample with said electron beam having first irradiation energy,
      controlling said negative voltage so that said secondary electron generation efficiency δ of a second irradiation energy of the electron beam is closer to 1.0 than that of said electron beam having said first irradiation energy.

2. The scanning electron microscope as defined in claim 1, comprising the steps of:
   controlling said negative voltage so that said second irradiation energy to be a voltage between 1 kV and 2 kV.

* * * * *